United States Patent [19]

Atteberry et al.

[11] Patent Number: 4,644,639
[45] Date of Patent: Feb. 24, 1987

[54] METHOD OF SUPPORTING AN ARTICLE

[75] Inventors: Jack H. Atteberry, Pleasant Hill; Rupert D. Clark, Kansas City, both of Mo.

[73] Assignee: AT&T Technologies, Inc., Berkeley Heights, N.J.

[21] Appl. No.: 684,892

[22] Filed: Dec. 21, 1984

[51] Int. Cl.4 .............................................. H01L 21/68
[52] U.S. Cl. .................................... 29/589; 38/102.2; 269/289 R
[58] Field of Search .................... 38/102, 102.1, 102.2, 38/102.3, 102.4, 102.5, 102.6; 29/589; 428/95; 156/345; 269/289 R

[56] References Cited

U.S. PATENT DOCUMENTS

| 935,841 | 10/1909 | Fife | 38/102.2 |
|---|---|---|---|
| 1,088,913 | 3/1914 | MacCune | 38/102.2 |
| 1,244,892 | 10/1917 | Preyer | 38/102.2 |
| 3,657,791 | 4/1972 | Hobbs | 29/239 |
| 4,296,542 | 10/1981 | Gotman | 29/574 |

Primary Examiner—Brian E. Hearn
Assistant Examiner—Tuan Quach
Attorney, Agent, or Firm—James H. Fox

[57] ABSTRACT

A mounting frame assembly (10) supports a semiconductor wafer (22) on an adhesively coated surface (18) of a polymer film (12). An inner mounting ring (16) and an outer mounting ring (17) feature complementary steps (47) and (52), respectively, which positively lock the outer ring (17) from moving with respect to the inner ring (16) during a wafer sawing operation in a direction of the plane wherein the wafer (22) is supported by the film (12).

4 Claims, 7 Drawing Figures

METHOD OF SUPPORTING AN ARTICLE

TECHNICAL FIELD

The present invention relates to methods of supporting an article, and to a mounting frame for tensioning a sheet of pliable material across an inner opening of the frame. A particular embodiment of the invention relates advantageously to supporting a semiconductor wafer on a diaphragm stretched across a mounting frame and to a mounting frame for streching and holding the diaphragm in the support of a semiconductor wafer.

BACKGROUND OF THE INVENTION

The semiconductor device manufacturing industry has applied a well known technique used in embroidery and other needle work to support semiconductor wafers during typical manufacturing processes, such as mechanical sawing operations. To support a semiconductor wafer during such a sawing operation, the wafer is mounted to an adhesively coated surface of a tightly stretched polymer sheet. One of the techniques adapted by the semiconductor industry for stretching the polymer sheet to a tight and substantially rigid support surface is a double hoop frame structure which is well known as a useful tool in the embroidery art, for example. The sheet of material is stretched and tensioned over the opening of an inner hoop. An outer hoop is fitted concentrically over the material into a coplanar position with the inner hoop. The size of the outer hoop is such that the material becomes clamped between inner and outer adjacent surfaces of the two hoops when they are located in their coplanar position.

In adapting the well known hoop principle to providing a support for an article such as a semiconductor wafer, the tightness of the polymer sheet and the physical dimensions of the hoops as frame members become critical. Particularly when the mounting frame formed by two concentric frame members and the adhesively coated polymer sheet support a semiconductor wafer during a sawing operation, the continued rigidity of the adhesively coated sheet throughout the operation is important. Also, the polymer sheet, unlike cloth material is typically smooth on one surface and exhibits a low coefficient of friction between that surface and an adjacent frame member. Low friction characteristics of the polymer sheet and a relatively thin material thickness of the sheet have caused prior art mounting frames to feature annular holding protrusions which are alternately positioned along the oppositely adjacent surfaces of the two frame members, so that the two frame members assume a defined, seated position with respect to each other.

The tensioning of the polymer sheet or film is simple because of the adhesive coating on only one surface of the film. In mounting the film to the frame, a properly sized piece of the film material is placed over the inner frame member with the adhesively coated surface directed upward or away from the inner frame member. The outer frame member is then placed concentrically over the inner one, such that a base surface of the outer frame member contacts the adhesively coated surface of the film. As the outer frame member is pushed down over and into coplanar position with the inner frame member, the adhesively coated surface of the film attaches itself to the outer frame member so that the film becomes tightened as the outer frame member is pushed into the coplanar position with respect to the inner frame member. The surface of the film opposite the adhesively coated surface slides easily relative to the inner frame member during the positioning of the two frame members with respect to each other, so that the film is uniformly tensioned when the two frame members are located in coplanar relationship with respect to each other.

The semiconductor wafer is then attached to the outwardly directed adhesive surface of the tightly stretched film in preparation for a sawing operation. During the sawing operation a cutting wheel of a sintered material containing diamond particles moves along straight lines of a grid pattern on the surface of the wafer to cut the wafer into individual, rectangular shaped semiconductor devices. The individual devices remain attached to the film after the sawing operation in the original array in which they were formed in the wafer. In such array they are tested, and the good devices are selectively removed from the array by a typical selective pick and place operation.

Problems in the referred to sawing operation result in occasional breakage of saw blades. The cost of replacing saw blades then adds significantly to the cost of the semiconductor devices. The blades are of a specially hardened material and are machined to a high degree of precision. A typical, state of the art saw blade has a thickness of 0.002 inch which is balanced to spin at typically 32,000 RPM. A likely cause for a saw blade to break has been identified as a contact by the blade with the outer frame member of the referred-to mounting frame.

The height of the saw blade is precisely adjusted to cut entirely through the thickness of the wafer which is typically 0.020 inch thick. The film which is typically 0.005 inch thick may become slightly scored but is not cut during the sawing operation. Thus, an observed occasional contact by the saw blade with the outer member of the mounting frame is attributed to a creeping movement by such outer member of the frame with respect its inner member during the sawing operation. It is suspected that tension forces in the film combine with high speed vibrational energy to cause an upward movement of the outer frame member into the path of the moving saw.

SUMMARY OF THE INVENTION

In accordance with the invention an article becomes supported on a mounting frame by first placing a sheet of pliable material over a first frame surface of an inner frame member to cover an opening in such first frame surface, such opening extending through the inner frame member. The inner frame member has a step in its outer wall. A ledge formed by the step extends peripherally around the inner frame surface and to a second frame surface, such that the second frame surface of the inner frame member is similar in shape but is smaller than the first frame surface of the inner frame member. The sheet of pliable material covering the opening becomes tensioned by an outer frame member which is placed concentrically with the inner frame member over the sheet and is urged into coplanar relationship with the inner frame member. The outer frame member has an inner wall which is complementary in shape to the outer wall of the inner frame member, such that an opening through a first frame surface of the outer frame member is smaller than an opening through a second, opposite frame surface, and the openings join in a plane parallel to the first and second frame surfaces of the outer frame member. A step in the inner wall of the outer frame member complementary to the step in the outer wall of the inner frame member consequently results in a ledge along the inner wall of the outer frame member. When the outer frame member is in a coplanar position with the inner frame member, the tension in the sheet urges the respective ledges of the inner and outer frame members into continued engagement, thereby securing the tensioned sheet between the ledges. The tensioned sheet is capable of supporting an article without risk of inducing relative movement between the inner and outer frame members.

BRIEF DESCRIPTION OF THE DRAWING

Various features and advantages of the invention will be best understood when the following detailed description is read in reference to the appended drawing wherein.

DETAILED DESCRIPTION

The Mounting Frame Assembly

Figure 1:
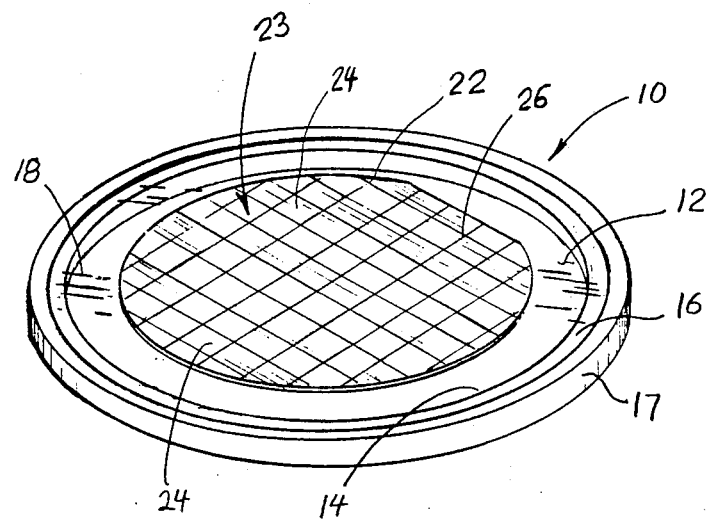
FIG. 1 is a pictorial view of a typical mounting frame, an improvement of which is the subject matter of this invention.

FIG. 1 shows a mounting frame assembly which is designated generally by the numeral 10. A sheet of material, such as a polymer film 12, is stretched across a central opening 14 through inner and outer frame members 16 and 17, respectively. Commercially available adhesively coated polymer films are pliably formed over the frame members and stretch resiliently to form a support. In the described embodiment, the inner and outer frame members 16 and 17 are ring-shaped in the plane of the polymer film 12 and are commonly referred to as hoops or rings. The outer diameter of the inner ring 16 is substantially the same as the inner diameter of the outer ring 17. Thus, when the rings 16 and 17 are concentrically and coplanarly located in the assembly 10, the polymer film 12 tends to become clamped between the rings 16 and 17.

In the assembly 10, the polymer film 12 is tightly stretched to serve as a planar support surface. An adhesively coated surface 18 faces away from the inner ring 16 and is referred to as an upper surface 18. The adhesive coating of the upper surface 18 is of a pressure sensitive adhesive which causes an object pressed into contact therewith to adhere to the upper surface 18. Such object may then be peeled or pulled out of contact with the adhesive without transferring any of the adhesive to the object. To illustrate an intended use of a preferred embodiment of the invention, FIG. 1 shows the mounting frame assembly 10 supporting a flat, circularly shaped semiconductor wafer 22 in the body of which an array 23 of semiconductor devices 24 has been formed. The mounting frame assembly 10 is particularly intended to support the wafer 22 during a sawing operation wherein the wafer 22 is cut along an orthogonal grid of boundary lines 26 to sever the wafer 22 into a plurality of separate devices 24. However, the separated devices 24 will remain attached to the upper surface 18 in their original array 23 until they are individually removed by a typical pick-and-place apparatus, not shown.

A Prior Art Frame Structure

Figure 2:
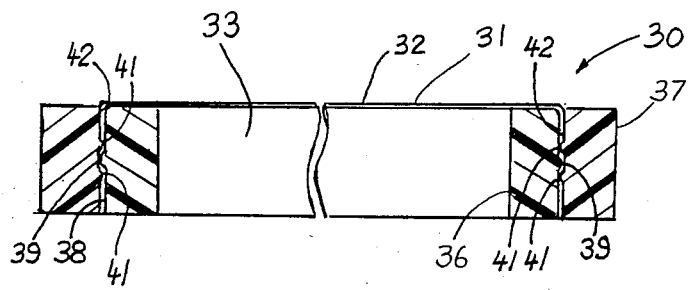
FIG. 2 is an enlarged sectional view of a prior art mounting frame to illustrate previously used protrusions on adjacent surface of frame members for seating the members with respect to each other.

FIG. 2 is a sectional view of a portion of a typical prior art mounting frame assembly 30. Basic structural elements of the prior art frame assembly 30 are similar to those of the previously described assembly 10. Distinctions between the prior art frame assembly 30 and the improved assembly 10 are best described in reference to sections through the frame members of the respective assemblies 10 and 30. The sectional view of the frame assembly 30 is taken in a plane perpendicular to the plane of an upper surface 31 of its respective polymer film 32 and through the center of an opening 33 covered by the film 32. FIG. 2 shows particular features of prior art inner and outer frame members 36 and 37, respectively, for promoting the retention of the film 32 and the seating of the frame members 36 and 37 with respect to each other.

An outer peripheral surface 38 of the inner frame member 36 features a single band-like protrusion 39 extending outwardly around the inner frame member 36. The outer frame member 37 features two similar, spaced, band-like protrusions 41 which extend in parallel to each other inwardly from an inner surface 42 of the outer member 37. When the inner and outer frame members are seated with respect to each other, the protrusions 41 extend on both sides next to the protrusion 39 along a common cylindrical interface between the frame members 36 and 37. The protrusions 39 and 41, consequently, press into the film from alternate sides to increase the clamping forces of the frame members 36 and 37 on the polymer film 32.

A problem experienced with the described prior art frame structure is believed to be related to a relatively low coefficient of friction between the inner frame member 36 and the polymer film 32 in comparison with the adhesive attachment of the film 32 to the outer frame member 37. It appears that even though the protrusions 39 and 41 form a seating position for the inner and outer frame members 36 and 37 with respect to each other, the tension in the film 32 tends to unseat the frame members occasionally during sawing operations. Slippage of the inner frame member 36 with respect to the film 32 then raises the outer frame member 37 above the plane defined by the film 32 as it is stretched across the opening 33 encompassed by the inner frame 36.

The Improved Mounting Frame

Figure 3:
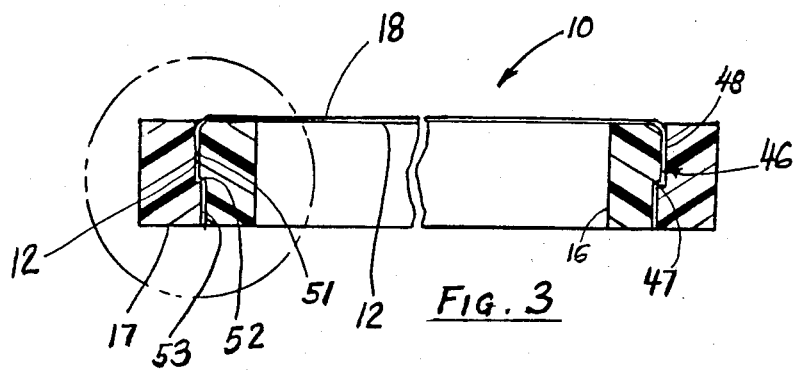
FIG. 3 is an enlarged sectional view of a mounting frame showing features of the present invention and particularly a ledge in each of the adjacent surfaces of frame members as an improvement over the prior art.

FIG. 3 shows a section through a portion of the mounting frame assembly 10. In distinction to prior art mounting frames, an outer wall 46 of the inner ring 16 shows a step 47 which causes the wall 46 to have a larger diametral size at an upper portion 48 adjacent to the plane of the upper surface 18 and then recede to a smaller diameter at the step 47. An inner wall 51 of the outer ring 17 features a complementary step 52. Consequently, a lower portion 53 of the inner wall 51 of the outer ring 17 has a similarly inwardly offset diameter.

As shown in FIG. 3, the polymer film 12 becomes sandwiched between the complementarily stepped walls 46 and 51. Unlike the prior art retention features, such as molded ribs, the steps 47 and 52 force the polymer film 12 into a distinct offset which extends substantially in a plane parallel to the upper surface 18 of the film 12.

Advantages of the described embodiment are best understood from interactions between the inner and outer rings 16 and 17 and the film 12 as these elements are urged into position with respect to each other. FIGS. 4 through 7 show a sequence of enlarged sections of the rings 16 and 17, substantially of the encircled portions in FIG. 3, with respect to which the relationship between the inner and outer rings 16 and 17 and the film 12 are explained.

Figures 4, 5:
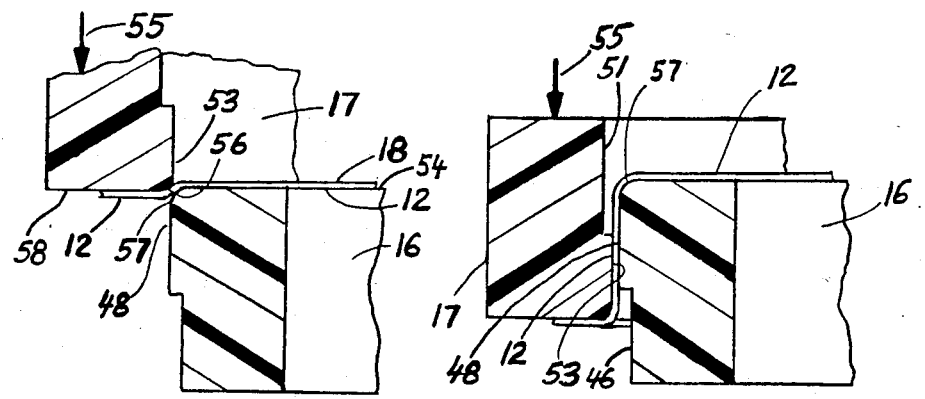
FIG. 4 through 7 are enlarged sectional views of a portion of the frame, encircled in FIG. 3, depicting various stages of engagement of the frame members to illustrate cooperative features and advantages of the frame members during the tensioning, use and removal of a support film in accordance with the invention.

FIG. 4 shows the film 12 having been placed over a first, upper frame surface 54 of the inner ring 16 such that the adhesively coated upper surface 18 of the film 12 is directed away from the inner ring 16. The outer ring 17 is centered with respect to the inner ring to be pushed into coplanar relationship with the inner ring 16 in the direction indicated by a force arrow 55. As the outer ring 17 is pushed downward, a rounded lower edge 56 of the outer ring engages the adhesively coated surface 18 of the film 12. The lower surface of the film 12 begins to slide over a rounded upper edge 57 of the inner ring 16 and is pulled into a constricted engagement between the surface portions 48 and 53 of the inner and outer rings 16 and 17, respectively. Peripheral portions of the film 12 are shown as adhering to a first, lower frame surface 58 of the outer ring 17. The adhesive contact between the film 12 and the lower frame surface 58 may at the very onset of the film tensioning help to stretch the film 12. However, the major holding force on the film 12 by the outer ring 17 is generated by the adhesive contact between the film and the surface portion 53 of the outer ring 17. The excess of the film 12 in contact with or extending below the lower frame surface 58 may be conveniently removed once the rings 16 and 17 are coplanarly seated, as shown in FIG. 3, for example.

FIG. 5 shows the film 12 squeezed between the lower portion 53 of the inner wall 51 of the outer ring 17 and the upper portion 48 of the outer wall 46 of the inner ring 16. The portions 48 and 53 of the walls 46 and 51 of the two rings engage the thickness of the film interposed between the engaging surfaces in an annular area which becomes smaller as the outer ring 17 advances in the direction of the arrow 55. The remaining area of interference between the wall portions 48 and 53 causes the pressure on the adhesive coating to increase to thereby continue to uphold non-slipping contact between the outer ring 17 and the film 12. As the outer ring 17 is pressed further downward toward its final coplanar position with the inner ring 16, the film 12 continues to stretch outwardly over the rounded edge 57 of the inner ring. The film 12 consequently becomes increasingly tensioned so that an increased urging force in the direction of the arrow 55 needs to be applied to push the outer ring 17 toward its coplanar position.

Figures 6, 7:
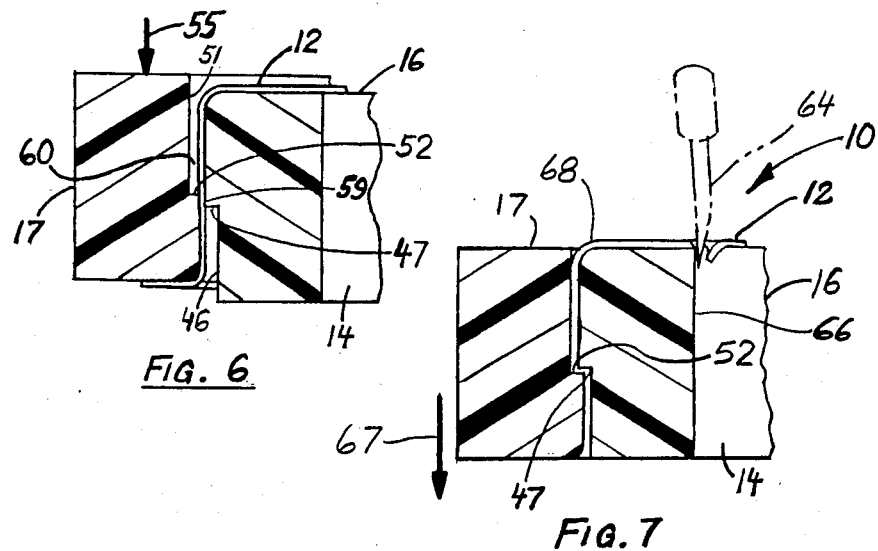

FIG. 6 shows the outer ring 17 as having advanced in the direction of the arrow 55 substantially to a coplanar position with the inner ring 16. However, the steps 47 and 52 of the adjacent complementary walls 46 and 51 are still not seated with respect to each other. In this position, the film 12 across the inner ring 16 has been stretched substantially to its maximum intended tension. A force opposing a full coplanar positioning of the inner and outer rings 16 and 17 has continually increased as a result of the increased tension in the film 12. However, the continued interfering engagement between the two rings 16 and 17 is exerting an increasingly tight grip on the film 12 because of a substantially decreased overlapping area 59 between which the film is being held with an increased pressure. An increasingly large, nonengaged offset space 60 between the walls 46 and 51 helps to distribute a pulling force on the film 12 to distribute the tension in the film more uniformly across the opening 14 of the inner ring 16.

When the inner and outer rings 16 and 17 are ultimately coplanarly located as shown in FIGS. 3 and 7, the steps 47 and 52 and the surface areas of the ledges which the steps represent positively lock any reverse vertical movement of the inner and outer rings 16 and 17 with respect to each other. To the extent that the tension in the film 12 seeks to draw the outer ring 17 upward, the ledge of the step 47 offers a positive stop to an upward movement of the combination of the outer ring 17 and the film 12. Any upward pulling force by the film 12 on the outer ring 17 tends to urge the combination of the film 12 and the step 52 of the outer ring 17 more tightly into contact with the step 47. The resulting pinching force securely retains the film 12 and the outer ring 17 with respect to the inner ring 16. The film 12 consequently remains a tightly stretched diaphragm across the opening 14 with adequate rigidity to support the wafer 22 as shown in FIG. 1 throughout a sawing operation.

The enlarged partial view of FIG. 7 conveniently illustrates how the described rings 16 and 17 are separated from each other after, for example, any workpieces are removed from the film 12. Known methods of removing used polymer films from their prior art mounting frames typically relied on pushing outer frame members, such as the member 37 in FIG. 2, upward with respect to the corresponding inner frame member 36 substantially in the same manner as embroidered cloth material is removed from embroidery hoops. Referring back to FIG. 7, because of the positive locking engagement between the presently described inner and outer rings 16 and 17 in combination with the film 12, an upward release of the outer ring 17 with respect to the inner ring 16 is no longer feasible. Also, the existing tension in the film 12 forecloses a sufficient downward movement of the outer ring 17 with respect to the inner ring 16 to remove the film 12 after pushing the outer ring 17 downward to release the film from a pinching engagement between the rings. However, recognizing that a piece of the film 12 is not reused in the presently described application to avoid a risk of dust particles from a previous wafer sawing operation from damaging semiconductor devices in a subsequently mounted wafer, cutting the film 12 to release the locking engagement of the rings 16 and 17 becomes a feasible step of releasing the film from the frame assembly 10.

FIG. 7, consequently, shows a cutting blade 64 in the process of making a cut along an inner boundary 66 of the inner ring 16. Once the film 12 which covers the opening of the inner ring is cut away, the outer ring 17 is readily pushed downward with respect to the inner ring 16 in the direction of an arrow 67. Remaining peripheral portions 68 of the film 12 which are adhesively attached to the outer ring 17 are readily peeled off from the ring 17 once the two rings 16 and 17 are separated. A new piece of the film 12 is then stretched across the opening 14 of the inner ring 16 in the described manner for a subsequent support and sawing operation.

Modifications

The described mounting frame assembly 10 includes features which readily adapt the present invention as an improvement of an existing wafer sawing operation. Changes and modification within the spirit and scope of the invention are possible without relinquishing advantageous results described and otherwise recognized hereby. A change in material, for example, of the described rings 16 and 17 from a thermosetting, glass-filled molded plastic to a metal, such as aluminum or stainless steel, is seen as one of a number of possible changes which do not adversely affect the advantageous locking characteristics of the described mounting frame assembly. The shape of mounting frame assembly 10 may also be changed from that of the described and preferred rings to a non-circular shape. However, it must be realized that a shape of frame members other than the circular shape of the rings will tend to non-uniformly stress a membrane, such as the described polymer film 12, as it becomes stretched across an inner opening. In certain applications a non-uniformly stressed membrane or film may be acceptable or even desirable for shapes of the mounting frame 12 other than the described rings. The peripheral wall 46 and its adjacent wall 51 may include edges or inside corners as discontinuities. Nevertheless, to the extent that each of the walls 46 and 51 defines a closed boundary of the respective frame member, such edges or corners are considered to be part of the shape of the wall.

Various other changes and modifications may be made without departure from the spirit and scope of the invention.

What is claimed is:

1. A method of supporting an article on a mounting frame which comprises:

placing a sheet of pliable material across an opening through an inner frame member of such mounting frame with an orientation with respect to such inner frame member which causes a peripheral right-angle ledge formed by an offset in an outer wall of the inner frame member to be directed away from the sheet of pliable material;

placing an outer frame member of such mounting frame concentrically with respect to the inner frame member over the sheet of pliable material, and with an orientation with respect to said inner frame member such that a right-angle ledge formed by an offset in the inner wall of the outer frame member complementary to the right angle ledge in the outer wall of the inner frame member is directed away from the sheet of pliable material;

urging the outer frame member into a coplanar position with the inner frame member, thereby grasping the sheet of pliable material between adjacent outer and inner walls of the inner and outer frame members, respectively, whereby the sheet becomes stretched across the opening through the inner frame member;

engaging the respective ledges in the outer and inner walls of the inner and outer frame members with the sheet grasped between engaged surfaces of such ledges, thereby locking the sheet of pliable material stretched across such opening; and mounting an article to the stretched sheet of pliable material to support such article thereon.

2. A method of supporting an article on a mounting frame according to claim 1, wherein the sheet of pliable material is adhesively coated on one surface thereof, and placing the sheet over the inner frame member comprises placing the sheet with the adhesively coated surface directed away from the inner frame member, placing the outer frame member over the sheet comprises placing the outer frame member into contact with the adhesively coated surface of the sheet, such that the sheet becomes positively attached to the outer frame member and stretches over the inner frame member as the outer frame member is urged into a coplanar position with the inner frame member, and engaging the respective ledges in the outer and inner walls comprises upon having urged the outer frame member into a coplanar position with the inner frame member, relaxing the urging force and allowing an existing tensile force of the stretched pliable material to pull the ledge in the inner wall of the outer frame member against the complementary ledge in the outer wall of the inner frame member to lock further movement of the frame members with respect to each other and enhance the adhesive contact between the outer frame member and the sheet.

3. A method of supporting an article on a mounting frame according to claim 2, wherein the article is a semiconductor wafer, the method comprising mounting the semiconductor wafer to the adhesively coated surface of the sheet, the tension in the stretched sheet maintaining the lower surface of the semiconductor wafer in a plane above upper boundaries of the inner and outer mounting frames.

4. A method of supporting an article on a mounting frame according to claim 3, wherein a series of semiconductor wafers are mounted in succession to the mounting frame to be supported during manufacturing operations on such semiconductor wafers, the method comprising, after completing each of such manufacturing operations, the sheet along an inner surface of the inner mounting frame thereby removing the sheet from said opening, separating the inner and outer mounting frames by urging the frames in a direction to move the complementary ledges away from each other, and removing any adhering portions of said sheet from the outer frame member before placing a subsequent adhesively coated sheet over the inner frame member in preparation for mounting a subsequent one of said series of semiconductor wafers.

* * * * *